(12) United States Patent
Bajuk et al.

(10) Patent No.: US 7,080,344 B2
(45) Date of Patent: Jul. 18, 2006

(54) CODING OF FPGA AND STANDARD CELL LOGIC IN A TILING STRUCTURE

(75) Inventors: Stanislav Peter Bajuk, Colchester, VT (US); Jack Robert Smith, South Burlington, VT (US); Sebastian Theodore Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 429 days.

(21) Appl. No.: 10/604,071

(22) Filed: Jun. 25, 2003

(65) Prior Publication Data

US 2004/0268288 A1   Dec. 30, 2004

(51) Int. Cl.
   *G06F 17/50* (2006.01)
(52) U.S. Cl. .............................. 716/16; 716/3; 717/141; 717/142; 717/143; 717/144; 717/136
(58) Field of Classification Search .................. 716/16, 716/3; 717/136, 141–144
   See application file for complete search history.

(56) References Cited

U.S. PATENT DOCUMENTS 5,995,730 A * 11/1999 Blinne ............................ 716/4
6,178,541 B1 * 1/2001 Joly et al. ..................... 716/17
6,779,156 B1 * 8/2004 Whitaker et al. ............... 716/1
2002/0066956 A1 * 6/2002 Taguchi ....................... 257/734
2003/0149954 A1 * 8/2003 McElvain et al. ............. 716/18

* cited by examiner

*Primary Examiner*—Jack Chiang
*Assistant Examiner*—Tuyen To
(74) *Attorney, Agent, or Firm*—Richard A. Henkler; Michael J. LeStrange; Dillon & Yudell LLP

(57) ABSTRACT

A method and system for storing and modifying register transfer language (RTL) described logic types. Upon a declaration of a signal interconnect, a language extension of a register transfer language is defined for the signal interconnect based on the signal interconnect's type. The language extensions allow different signal interconnect types, such as those used with field programmable gate arrays (FPGA) and standard cells, to be stored in a same file array hierarchy. This storage facilitates changing logic types, thus ultimately resulting in an integrated circuit (IC) that is either smaller (using more standard cells) or more flexible (using more FPGA cells). The transition from one RTL type to another is performed within the physical design cycle, in which wiring, timing and placement of components (information) is performed before masking out the final chip design.

20 Claims, 8 Drawing Sheets

| | WIRE TYPE | MEANING | FIXED OR ADJUSTABLE |
|---|---|---|---|
| 302 | (S)wire | STANDARD CEL | FIXED |
| 304 | Fwire | FPGA | FIXED |
| | | | |
| 306 | sFwire | TOOL REPARTITION REQUEST: FPGA -> STD CELL | ADJUSTABLE |
| 308 | fSwire | TOOL REPARTITION REQUEST: STD CELL -> FPGA | ADJUSTABLE |
| | | | |
| 310 | Sfwire | STANDARD CELL, ACCEPTED BY DESIGNER | ADJUSTABLE |
| 312 | Fswire | FPGA, ACCEPTED BY DESIGNER | ADJUSTABLE |

FIG. 3

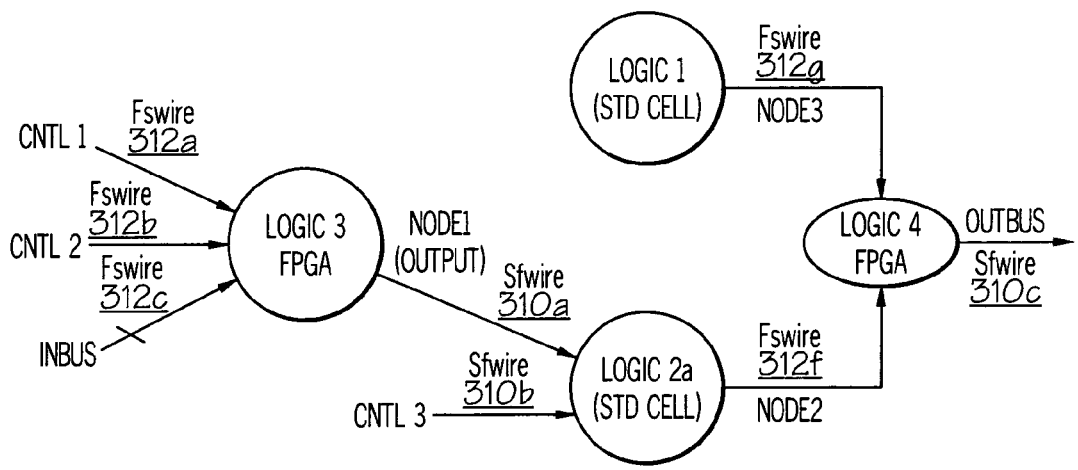

EXAMPLE VERILOG
module MyDesign (CNTL1, CNTL2, INBUS, CNTL3, OUTBUS);
input Fswire CNTL1, CNTL2;
input Fswire [7:0] INBUS;
input Fswire CNTL3;
Sfwire NODE1;
Fswire NODE2, NODE3;
ouput Sfwire [7:0] OUTBUS;

FIG. 4A

EXAMPLE VERILOG
module MyDesign (CNTL1, CNTL2, INBUS, CNTL3, OUTBUS);
input Fswire CNTL1, CNTL2;
input Fswire [7:0] INBUS;
input Fswire CNTL3;
fSwire NODE1;
Fswire NODE2, NODE3;
ouput Sfwire [7:0] OUTBUS;

EXAMPLE VERILOG
module MyDesign (CNTL1, CNTL2, INBUS, CNTL3,
OUTBUS);
input Fswire CNTL1, CNTL2;
input Fswire [7:0] INBUS;
input Fswire CNTL3;
Fswire NODE1;
Fswire NODE2, NODE3;
ouput Sfwire [7:0] OUTBUS;

CODING OF FPGA AND STANDARD CELL LOGIC IN A TILING STRUCTURE

BACKGROUND OF INVENTION

1. Technical Field

The present invention relates in general to a field of logic design, and in particular to the partitioning and synthesis of field programmable gate array (FPGA) and standard cell logic. Still more particularly, the present invention relates to a method and system for dynamically shifting the boundary between FPGA and standard cell logic within a physically placeable block that can simultaneously hold both FPGA and standard cell elements

2. Description of the Related Art

Building computer logic takes many steps before the computer logic is physically manufactured. The logic designer typically uses synthesis tools, such as register transfer languages (RTL) such as VerilogÂ® and VHDL (Very-high-speed-integrated-circuit Hardware Descriptor Language) to describe, design and document electronic circuits. A typical RTL file includes a description of the interfaces to the logic and its behavior.

Two types of devices that can implement logic are FPGA (Field Programmable Gate Arrays) and Standard Cell. FPGA's use a 2-dimensional array of logic cells that are programmable, such that the FPGA functions as a custom integrated circuit (IC) that is modified by program code. Thus, a same FPGA can be alternately programed to selectively perform the function of many different logic circuits. Typically, the programming of the FPGA is persistent until re-programmed at a later time. The persistent nature may be permanent (e.g, by blowing fuses in gates) or modifiable (by storing the programming code in a programmable memory). Standard cell, on the other hand, is hard-wired logic that is not modifiable after it is manufactured. Although it does not have the flexibility of a FPGA, standard cells is usually much faster than FPGA. Furthermore, FPGA's typically have many more gates and logic components than standard cells, since only a part of the FPGA circuit is typically used in any selected programmed configuration. Thus, FPGA's provide flexibility through their modifiable nature, but standard cell is faster and takes up less die space to implement a given logic function.

RTL synthesis takes an RTL file and maps it into a technology supplied by the semiconductor vendor. For example, standard cell synthesis takes a standard cell RTL file and maps out a selection of logic available from the vendor's library, which includes elements such as adders, exclusive OR's (XOR's), AND gates, etc Similarly, FPGA synthesis maps an FPGA file into an FPGA fabric, supplying program information required for a particular FPGA using configuration files supplied by the vendor.

In the prior art, FPGA and standard cell logic are created by synthesizing separate RTL files tbr the FPGA logic and other files for standard cell logic. In some situations, the logic designer may elect to move logic across the boundary, for example from FPGA to standard cell. However, the RTL descriptor files as used in the prior art require FPGA files and standard cell files to be in separate files, as shown in FIG. 1a as EPGA file array 110 and standard cell file array 112. When the logic designer wishes to repetition logic, such as changing an FPGA logic to a standard cell logic, the logic designer must manually remove an RTL EPGA descriptor from the EPGA file array 110, and then manually add an RTL standard cell descriptor for the changed logic to the standard cell file array 112. Although changing logic from FPGA to standard cell or vice versa is fairly simple if only a few functions are involved, when modifying many functions, the process of keeping files organized becomes very difficult and prone to introducing logic errors. This complexity is compounded by the prior art RTL's requirement that FPGA and standard cell flies be in different arrays as described above. Thus, it would be beneficial if both FPGA and standard cell files could be stored and manipulated in the same file array, and the boundary between FPGA and standard cell could be dynamically and easily modified during the design process.

SUMMARY OF INVENTION

The present invention is directed to a method and system for storing and modifying register transfer language (RTL) described logic types. Upon a declaration of a signal interconnect, a language extension of a register transfer language is defined for the signal interconnect based on the signal interconnect type. The language extensions allow different signal interconnect types, such as those targeted to field programmable gate arrays (FPGA) and standard cells, to be stored in a same RTL file. This storage facilitates changing logic types, thus ultimately resulting in an integrated circuit (IC) that is either smaller (using more standard cells) or more flexible (using more FPGA cells). Repartitioning of the RTL can be performed within the physical design cycle, in which wiring, timing and placement of components (information) is performed before masking out the final chip design.

A tile is a physically placeable block that contains some portion of FPGA (0% to 100%) and another portion of standard cell (0% to 100%). By having the technology vendor's library offer several variations of tiles, all of which have the same outline size but different portions of FPGA and standard cell, the designer can repetition logic with a tile and replace it during the physical design phase with an alternate tile that represents the new partition. In addition, the library preferably contains tiles of smaller and larger sizes that can be selected to implement the logic in the appropriate amount of area on the IC.

The above, as well as additional objectives, features, and advantages of the present invention will become apparent in the following detailed written description.

BRIEF DESCRIPTION OF DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, where:

FIG. 3 is a table depicting new RTL wire type declarations as taught by the present invention;

FIGS. 4a–c depict how a portion of a design is repartitioned to move from standard cell to FPGA using the wire types described in the present invention, where FIG. 4a depicts an initial logic partitioning, FIG. 4b shows a new partitioning requested by a design tool, and FIG. 4c illustrates a final partition;

DETAILED DESCRIPTION

Figure 1A:
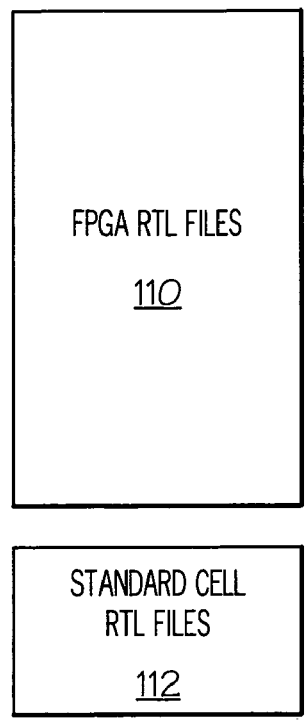
FIG. 1a depicts a prior art in which separate register transfer language (RTL) files are created and maintained for FPGA and standard cell portions of a design.
Figure 1B:
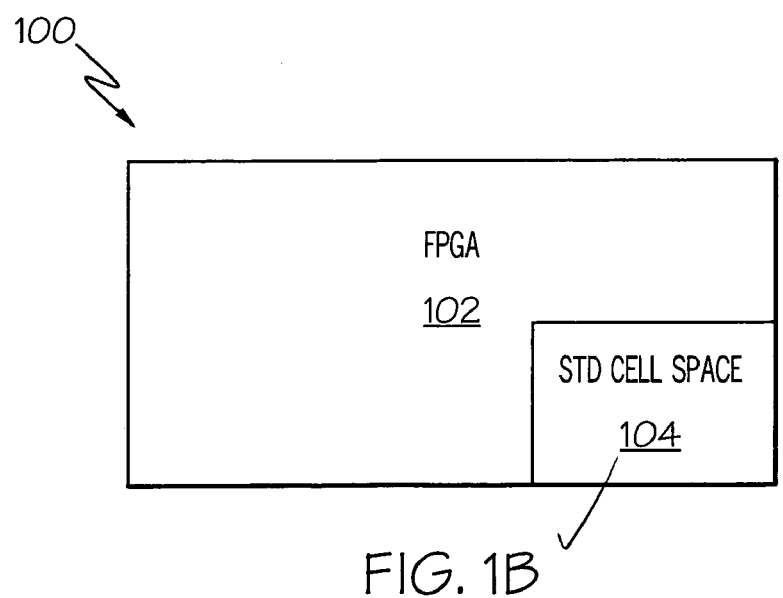
FIG. 1b illustrates a placeable logic tile composed of field programmable gate array (FPGA) logic and standard cell space logic.
Figure 1C:
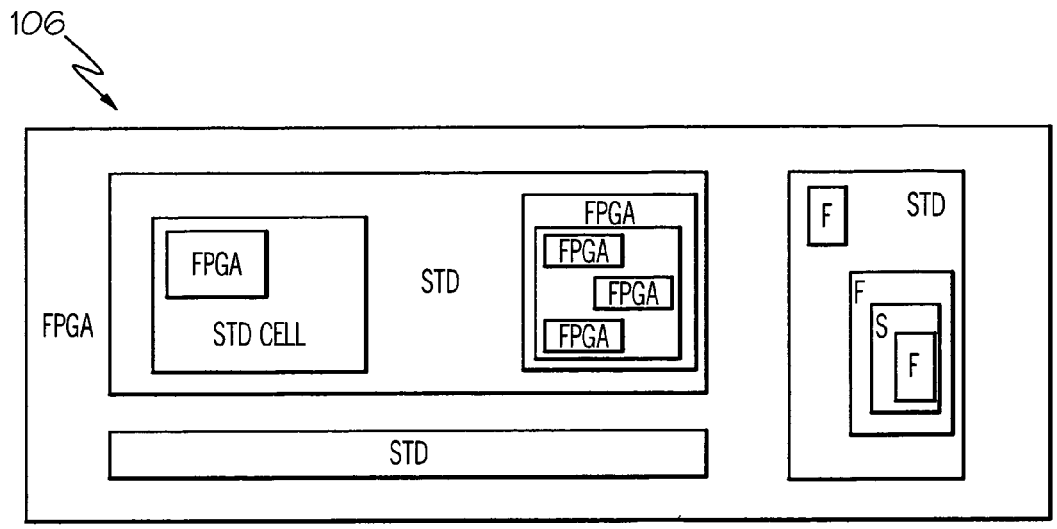
FIG. 1c depicts a complex hierarchical application specific integrated circuit (ASIC) design composed of many FPGA and standard cell files.

With reference now to FIG. 1b, there is depicted a placeable logic tile composed of field programmable gate array (FPGA) 102 logic and standard cell 104 logic, as defined and understood by the teachings of the present invention. Such a placeable logic tile may be highly complex as contemplated by the present invention, as illustrated in FIG. 1c.

Figure 2:
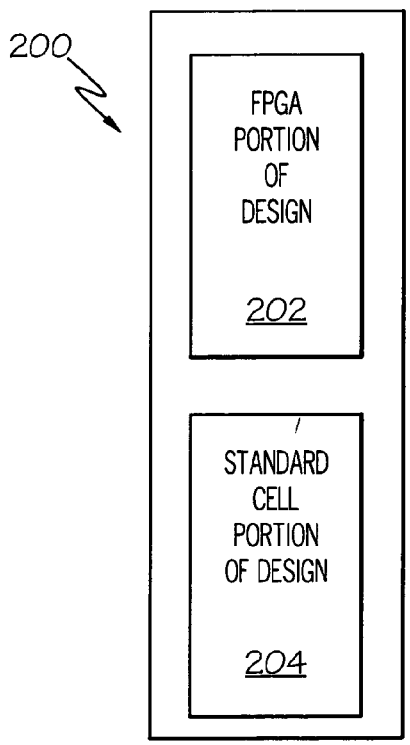
FIG. 2 illustrates a register transfer language (RTL) file that targets portions of a design to FPGA and other portions to standard cells as accomplished through the use of the present invention.

With reference now to FIG. 2, there is depicted a single RTL file array 200 containing logic that is targeted to both FPGA and standard cell. FPGA logic 202 and standard cell logic 204 are able to reside in the same RTL file 200 since they have file extensions, described in detail below, defining the interconnects ("wires") to each type of logic, thus allowing synthesis tools to recognize and handle each portion appropriately.

Unlike prior art RTL files in which only a single wire type ("wire") was defined without regard to whether the design was targeted to FPGA or standard cell technology, the present invention defines multiple wire types, as shown in FIG. 3. RTL files under the present invention have extensions defining one of six different types of wires. A wire is defined as an RTL-specific interconnect type, such as an input node, an output node, or an internal connection node in a logic, that carries a logic signal (i.e., is not a power line).

Extension 302 (Swire) describes/defines a standard cell fixed wire, which cannot be modified to become an FPGA wire. Extension 304 (Fwire) describes/defines an FPGA wire, which cannot be modified to become a standard cell wire. Extension 306 (sFwire) describes an intermediate wire type, which, as described in more detail below, is an FPGA wire that can later be modified to become a standard cell wire. Extension 308 (fSwire) describes another intermediate wire type, which, as described below, is a standard cell wire that can later be modified to become an FPGA wire. Extension 310 (Sfwire) describes a standard cell wire, which can be modified to become an FPGA wire. Extension 312 (Fswire) describes an FPGA wire, which can be modified to become a standard cell wire.

With reference now to FIG. 4a, there is depicted a block diagram of an initial logic partitioning having four example logics and their interconnect wires. Logic 3 is an FPGA logic, and as such has only FPGA type input wires, which as shown are two control lines (cntl1 and cntl2) identified and defined as Fswire's 312a and 312b. Also input into logic 3 is an 8-bit inbus identified as Fswire 312c. Note that only Fswire defined wires are able to be input into an FPGA logic. The output of FPGA logic 3 is shown as node1 which is an Sfwire 310a. That is, the output of the FPGA logic 3 does not have to be an FPGA wire; only the input to an FPGA logic must be an FPGA wire.

Sfwire 310a is input into logic 2a, which is a standard cell logic. Also input into logic 2a is a control line (cntl3) identified and described as Sfwire 310b. Analogous to an FPGA logic, a standard cell logic can take only standard cell inputs. Logic 2a has an output at node2 identified and described as Fswire 312f, which is one of the inputs to FPGA logic 4. The other input to FPGA logic 4a is Fswire 312g, coming from the node3 output of standard cell logic 1. The output from logic 4 is the outbus identified/described as Sfwire 310c. Also shown in FIG. 4a is Verilog® pseudo code describing this initial logic partitioning.

Figure 4B:
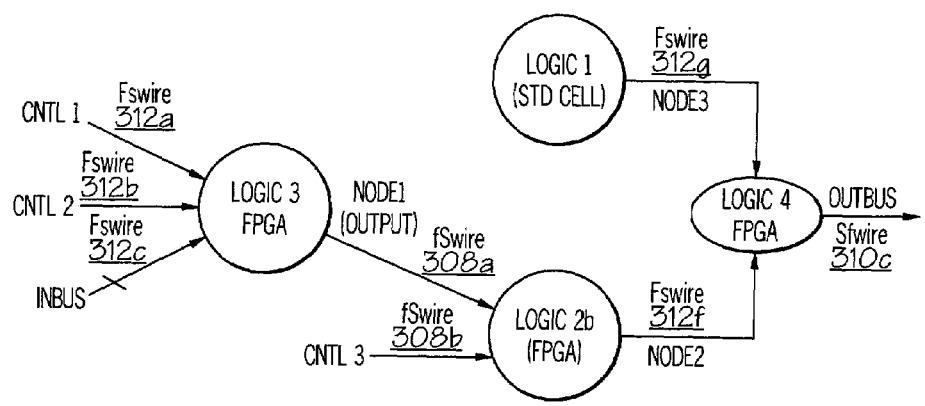

As each of the wires shown in FIG. 4a are adjustable, this indicates that they can be transformed to an FPGA or standard cell wire if the logic to which they are input changes. In a preferred embodiment, however, such a transformation of wires takes two steps, an intermediate step and a final step, in order to allow the logic designer an opportunity to accept or reject the proposed wire changes. Such an intermediate step, along with pseudo code, is illustrated in FIG. 4b. The only logic to be changed from that shown in FIG. 4a is logic 2b, which is now proposed as an FPGA logic cell. Logic 2b must now have FPGA input wires, which are illustrated as proposed wires fSwire 308a and fSwire 308b.

Figure 4C:
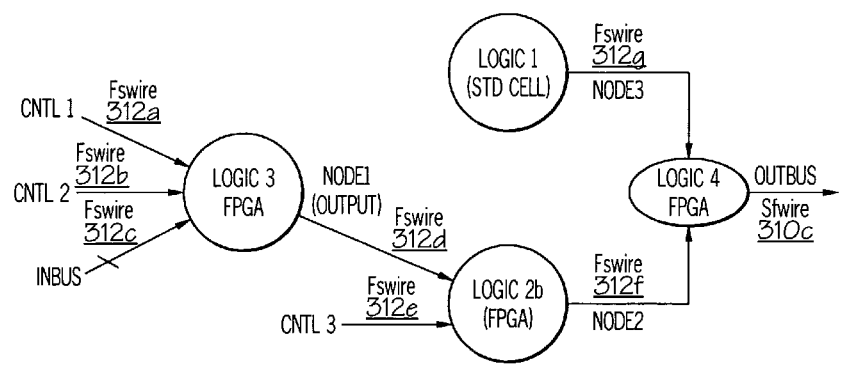

FIG. 4c illustrates the state of the logic shown in FIGS. 2a–b after moving logic 2 to FPGA. If proposed fSwires 308a and 308b are accepted by the logic designer, then they are designated/defined as final wires Fswire 312d and Fswire 312e. Incremental synthesis of logic into FPGA is thus permitted as the inputs are now properly defined.

Figure 5A:
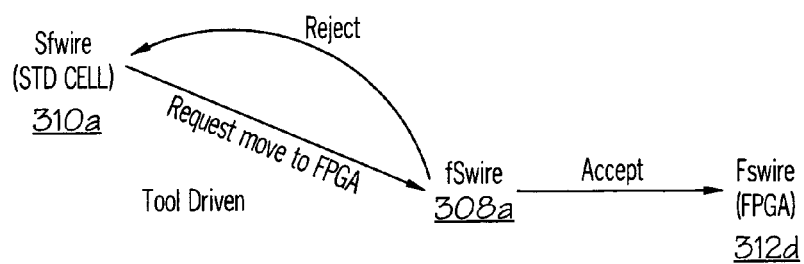
FIGS. 5a–b illustrate options for partitioning a standard cell wire and an FPGA wire.

The process shown in FIGS. 4a–c is summarized in FIG. 5a. Sfwire 310a was originally an input to a standard cell. A tool driven request is then made to move the standard cell into FPGA, resulting in the input to the new FPGA cell to be temporarily defined as fSwire 308a. If the logic designer accepts the change, then the fSwire 308a is redefined as Fswire 312d, which it will remain (as an FPGA wire) unless another request comes in requesting the change it back into a standard cell wire.

Figure 5B:
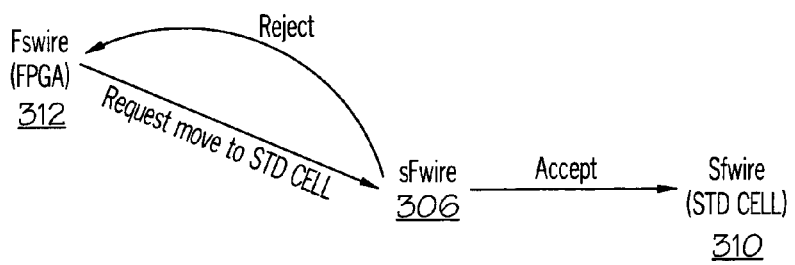

FIG. 5b describes a similar process as shown in FIG. 5a, except that the process is used to redefine an FPGA wire into a standard wire. Thus, an FPGA Fswire 312, upon a tool driven request to move the logic, to which Fswire 312 is an input, from FPGA to a standard cell, redefines the Fswire 312 to the intermediate definition sFwire 306. If the logic designer accepts the change, then the sFwire 306 is redefined as final standard cell wire Sfwire 310, whose definition will remain unless a new request comes in the change back to FPGA logic.

Figure 6:
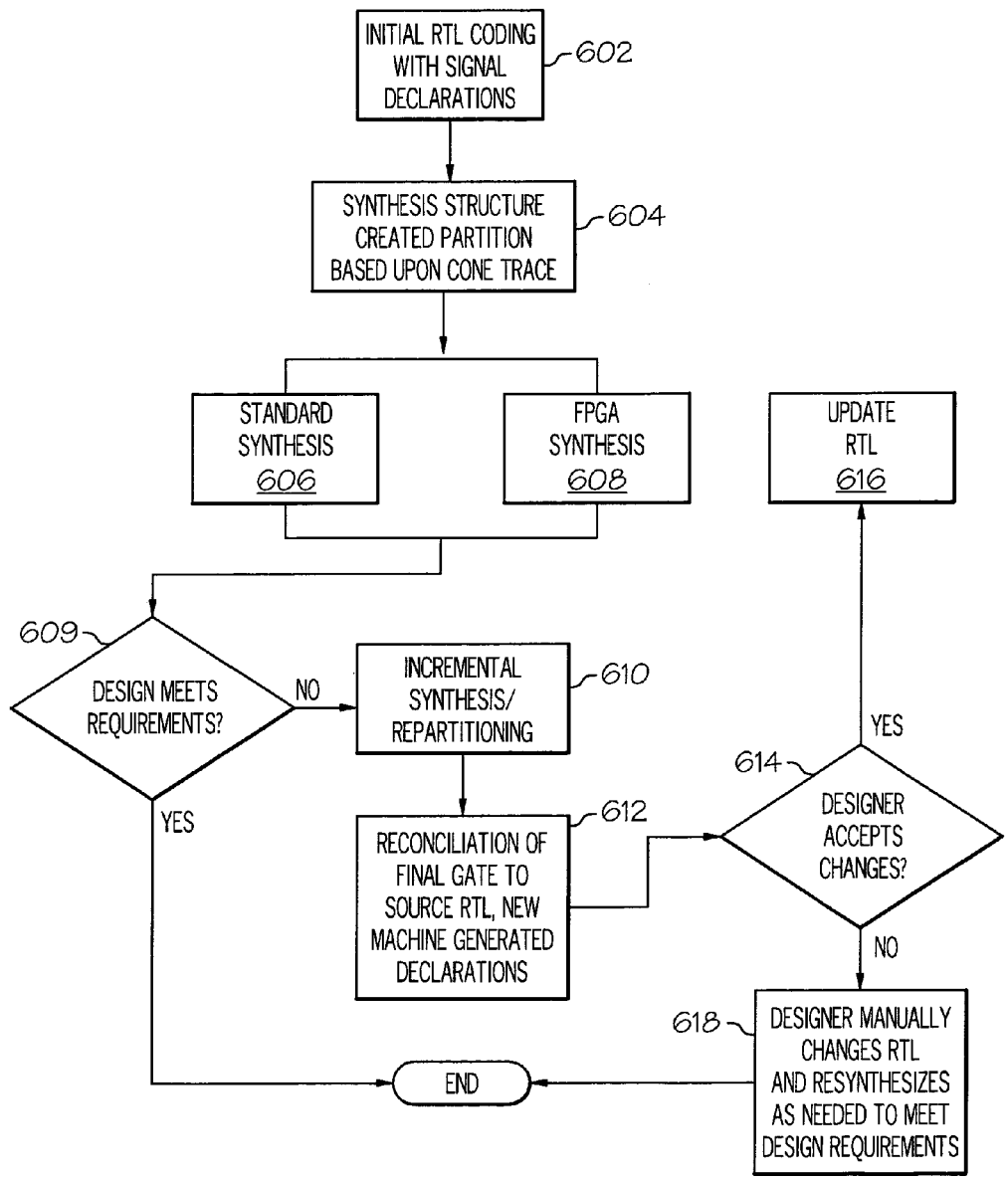
FIG. 6 is a flow-chart describing the design flow from initial RTL through synthesis, repartitioning the FPGA/Standard Cell boundary to meet design constraints, and updating the RTL to reflect the new boundary.

Referring now to FIG. 6, there is illustrated a flow-chart of a process of utilizing the re-designation of wires to achieve an optimal logic chip. Starting at block 602, the initial coding with signal declarations is performed in the RTL file. That is, an original "layout" of the chip using FPGA and standard logic cells is defined in the RTL file. Using a retrieval process, known as "cone trace," each portion of RTL code, both for FPGA and standard cells, is retrieved (block 604), and the standard cells and FPGA cells are mapped onto the technology (synthesized), whether that be an FPGA cell (defining code used to program the FPGA cell shown in block 608) or a standard cell (defining the layout of hard logic as shown in block 606). A preliminary decision is made (block 609) as to whether the design meets the overall circuitry requirements as defined by the circuit designer. If so, then the process ends. If not, then there is an incremental synthesis/repartitioning of the logic, as described in block 610, by moving at least a portion of the logic from one logic type to another (FPGA to standard cell or standard cell to FPGA) to meet the design requirements. Change suggestions are then made to reconcile the wire inputs to the newly defined logic partition (block 612), preferably using the fSwire or sFwire designations. If the logic designer accepts the changes (decision block 614) then the RTL file is updated with the new wire designation (Fswire or Sfwire), as described in block 616. If the designer does not accept the suggested change, then the designer can manually change the RTL and resynthesizes as needed to meet the design requirements (block 618).

Figure 7A:
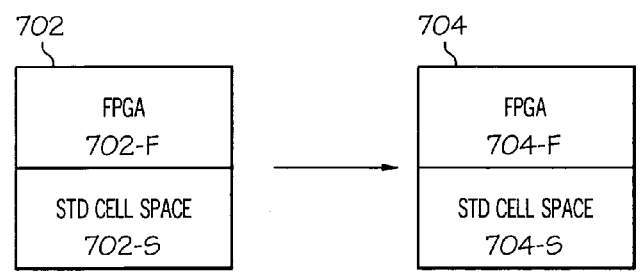
FIGS. 7a–b depict a logic repartitioning step to accomplish either greater speed (with smaller size) or greater flexibility.

The iterative process described above allows the logic designer to dynamically change the structure of the logic without manually having to delete wires and constructs from one RTL file (such as an FPGA file) and then re-building the deleted wires/constructs for the new logic in another RTL file (such as a standard cell file). The process described in FIG. 6 thus allows the logic designer to optimize the logic according to the need for flexibility or speed/size. Thus, as shown in FIG. 7a, if the designer of logic tile 702 wishes to place more logic in standard cells to have a small die size and a faster chip (but at the expense of flexibility), then logic cells and their wires are moved from FPGA 702-F to standard cell space 702-S, resulting in a smaller FPGA 704-F and a slightly larger standard cell space 704-S, resulting in an overall faster and smaller logic tile 704. Similarly, as shown in FIG. 7b, if the logic designer wishes to make logic tile 706 more flexible, then logic is moved from standard cell space 706-S to FPGA 706-F, resulting in a slightly larger, slower, but more flexible logic tile 708, composed of FPGA 708-F and standard cell space 708-S.

Figure 7B:
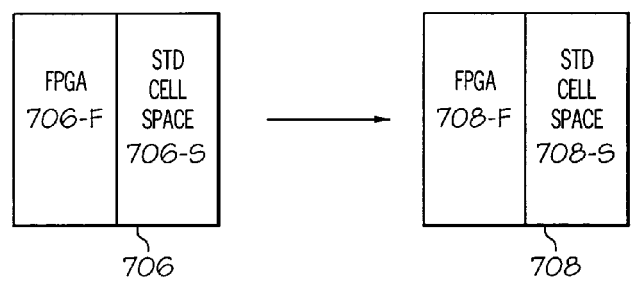

In a preferred embodiment, however, the size of each of the tiles shown in FIGS. 7a–b are the same size. When an FPGA migrates into a standard cell space, it is assumed that the standard cell space is not fully occupied, and therefore the larger FPGA can occupy not only the replaced standard cell, but the previously unoccupied standard cell space as well, resulting in a same size tile. One advantage of using tiles of the same size is that this allows the contents of a tile to be repartitioned and replaced during the physical design phase without disturbing the placement and wiring of the rest of the chip. However, there may be situations where it is advantageous to increase or decrease the tile size, thus it is advantageous to have various sizes of tiles available in the technology vendor's library.

It should be understood that at least some aspects of the present invention may alternatively be implemented in a program product. Programs defining functions on the present invention can be delivered to a data storage system or a computer system via a variety of signal-bearing media, which include, without limitation, non-writable storage media (e.g., CD-ROM), writable storage media (e.g., a floppy diskette, hard disk drive, read/write CD ROM, optical media), and communication media, such as computer and telephone networks including Ethernet. It should be understood, therefore in such single-bearing media when carrying or encoding computer readable instructions that direct method functions in the present invention, represent alternative embodiments of the present invention. Further, it is understood that the present invention may be implemented by a system having means in the form of hardware, software, or a combination of software and hardware as described herein or their equivalent.

While the invention has been particularly shown and described with reference to a preferred embodiment, it will be understood by those skilled in the art that various changes in form and detail may be made therein without departing from the spirit and scope of the invention.

The invention claimed is:

1. A method for creating a logic design using a register transfer language, said method comprising: upon a declaration of a signal interconnect, defining a language extension of a register transfer language for the signal interconnect based on a signal interconnect type; storing different signal interconnect types in a same design file; and creating a logic design by partitioning between different types of cells in the logic design, wherein the different types of cells are based on the different signal interconnect types as described byte language extensions.

2. The method of claim 1, wherein the same design file is a register transfer language (RTL) design file.

3. The method of claim 1, wherein the signal interconnect type is either a field programmable gate array (FPGA) type interconnect or a standard cell type interconnect.

4. The method of claim 3, further comprising: reading the same file with a tool that, based on available interconnect types, extracts an FPGA portion of the logic design and a standard cell portion of the logic design, wherein each portion of the logic design is synthesized using a synthesis tool appropriate for the type of interconnect.

5. The method of claim 3, further comprising: dynamically changing the language extension upon a change in the signal interconnect type.

6. The method of claim 5, wherein the step of dynamically changing the language extension includes first changing the language extension to an intermediate language extension to reflect a suggested change in the signal interconnect type, and upon the suggested change in the signal interconnect type being accepted, changing the intermediate language extension to a final language extension that describes the accepted changed signal interconnect type.

7. The method of claim 6, further comprising: repeatedly changing the signal interconnect type from an FPGA type to a standard cell type until a minimum die size is achieved.

8. The method of claim 6, further comprising: repeatedly changing the signal interconnect type from a standard cell type to an FPGA type to create a flexiblelogic design.

9. A system for creating a logic design using a register transfer language, said system comprising means for, upon a declaration of a signal interconnect, defining a language extension of a register transfer language for the signal interconnect based on a signal interconnect type; means for storing different signal interconnect types in a same design file; and means for creating a logic design by partitioning between different types of cells in the logic design, wherein the different types of cells are based on the different signal interconnect types as described by the language extensions.

10. The system of claim 9, wherein the same design file is a register transfer language (RTL) design file.

11. The system of claim 10, wherein the signal interconnect type is either a field programmable gate array (FPGA) type interconnect or a standard cell type interconnect.

12. The system of claim 11, further comprising: means for dynamically changing the language extension upon a change in the signal interconnect type.

13. The system of claim 12, wherein the means for dynamically changing the language extension includes means for first changing the language extension to an intermediate language extension to reflect a suggested change in the signal interconnect type, and upon the suggested change in the signal interconnect type being accepted, changing the intermediate language extension to a final language extension that describes the accepted changed signal interconnect type.

14. The system of claim 13, further comprising: means for repeatedly changing the signal interconnect type from an FPGA type to a standard cell type until a minimum die size is achieved.

15. The system of claim 13, further comprising: means for repeatedly changing the signal interconnect type from a standard cell type to an FPGA type to create a flexibleogic design.

16. A computer program product, residing on a computer usable medium, for creating a logic design using a register transfer language, said computer program product comprising: program code for, upon a declaration of a signal interconnect, defining a language extension of a register transfer language for the signal interconnect based on a signal interconnect type; program code for storing different signal interconnect types in a same register transfer language (RTL) file; and program code for creating a logic design by partitioning between different types of cells in the logic design, wherein the different types of cells are based on the different signal interconnect types as described by the language extensions.

17. The computer program product of claim 16, wherein the signal interconnect type is either a field programmable gate array (FPGA) type interconnect or a standard cell type interconnect.

18. The computer program product of claim 17, further comprising: program code for dynamically changing the language extension upon a change in the signal interconnect type.

19. The computer program product of claim 18, wherein the program code for dynamically changing the language extension includes program code for first changing the language extension to an intermediate language extension to reflect a suggested change in the signal interconnect type, and upon the suggested change in the signal interconnect type being accepted, changing the intermediate language extension to a final language extension that describes the accepted changed signal interconnect type.

20. The computer program product of claim 19, further comprising: program code for repeatedly changing the signal interconnect type from an FPGA type to a standard cell type until a minimum die size is achieved.

* * * * *

UNITED STATES PATENT AND TRADEMARK OFFICE
CERTIFICATE OF CORRECTION

PATENT NO. : 7,080,344 B2  Page 1 of 1
APPLICATION NO. : 10/604071
DATED : July 18, 2006
INVENTOR(S) : Bajuk et al.

It is certified that error appears in the above-identified patent and that said Letters Patent is hereby corrected as shown below:

In Claim 15, at column 7, line 10, delete "flexibleogic" and insert --flexible logic--.

Signed and Sealed this

Fifth Day of December, 2006

JON W. DUDAS
*Director of the United States Patent and Trademark Office*